US012609147B2

(12) United States Patent
Lee et al.

(10) Patent No.: US 12,609,147 B2
(45) Date of Patent: Apr. 21, 2026

(54) MEMORY DEVICES AND STACK MEMORY DEVICES GENERATING DATA STROBING SIGNAL FOR DATA OUTPUT

(71) Applicant: SK hynix Inc., Icheon-si (KR)

(72) Inventors: Chang Kwon Lee, Icheon-si (KR);
Jong Chan Yoon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 137 days.

(21) Appl. No.: 18/629,034

(22) Filed: Apr. 8, 2024

(65) Prior Publication Data

US 2025/0157511 A1      May 15, 2025

(30) Foreign Application Priority Data

Nov. 13, 2023     (KR) ......................... 10-2023-0156639

(51) Int. Cl.
*G11C 7/22*          (2006.01)
*G11C 7/10*          (2006.01)
(52) U.S. Cl.
CPC ............ *G11C 7/222* (2013.01); *G11C 7/1039* (2013.01); *G11C 7/1066* (2013.01); *G11C 7/1069* (2013.01)

(58) Field of Classification Search
CPC ...................................................... G11C 7/222
See application file for complete search history.

(56) References Cited

U.S. PATENT DOCUMENTS

| | | |
|---|---|---|
| 2014/0192583 A1 | 7/2014 | Rajan et al. |
| 2023/0298631 A1* | 9/2023 | Park ........................ H01L 25/18 |
| 2023/0393740 A1* | 12/2023 | Hinck ................... G06F 3/0626 |

FOREIGN PATENT DOCUMENTS

KR        1020210051365 A        5/2021

* cited by examiner

*Primary Examiner* — Hoai V Ho
(74) *Attorney, Agent, or Firm* — WILLIAM PARK AND ASSOCIATES LTD.

(57)          ABSTRACT

A memory device includes a base chip configured to generate a first read flag, a second read flag, and a plurality of alignment data strobing signals, responsive to a clock signal and a control signal, and a memory chip configured to output data stored in a first pseudo channel included in a memory core as pipe data, responsive to the first read flag and the alignment data strobing signals, and output data stored in a second pseudo channel included in the memory core as the pipe data, responsive to the second read flag and the alignment data strobing signals.

18 Claims, 8 Drawing Sheets

MEMORY DEVICES AND STACK MEMORY DEVICES GENERATING DATA STROBING SIGNAL FOR DATA OUTPUT

CROSS-REFERENCE TO RELATED APPLICATIONS

The present application claims priority under 35 U.S.C. 119 (a) to Korean Patent Application No. 10-2023-0156639, filed in the Korean Intellectual Property Office on Nov. 13, 2023, the entire contents of which application is incorporated herein by reference.

BACKGROUND

1. Technical Field

Some embodiments of the present disclosure relate to memory devices and stack memory devices generating data strobing signals for data output.

2. Related Art

Recently, stack memory systems such as high bandwidth memory (HBM) devices have been used in a wide range of applications due to excellent bandwidth and energy efficiency. Unlike the existing memory system that uses a parallel data bus, the stack memory system includes a stack memory device composed of a base chip and a plurality of memory chips interconnected by through silicon vias (TSV, hereinafter referred to as "through-vias"). When the base chip receives data output from the memory chip and transmits the data to a controller during a read operation, the base chip generates a data strobing signal generated responsive to a clock signal and transmits the data strobing signal to the memory chip, so that the data can be adjusted to be output from the memory chip, responsive to the data strobing signal.

SUMMARY

In accordance with an embodiment of the present disclosure, a memory device may include a base chip configured to generate flags, which are of course signals. The word flag should therefore be construed as any kind of electrically-measurable signal, which indicates the occurrence of an event.

Generated flags include a first read flag, a second read flag, and a plurality of alignment data strobing signals, all of which may be generated in response to a clock signal and control signals. In other words, flags are "based on" or "responsive to" the occurrence of a clock signal and a control signal.

clock signal A memory chip may be configured to output data stored in a first "pseudo channel." "Pipe data" stored in a pseudo channel, is data obtained from a data pipe. A "data pipe" is a first-in/first-out (FIFO) buffer. "Pipe data" is thus data obtained from a FIFO (first-in/first out) buffer commonly known as a "data pipe."

In one embodiment, a "pseudo channel" may be physical memory, wherein individual data items can be stored in a particular order or sequence and subsequently read out of the same memory in the same order in which they were stored.

In another embodiment, a "pseudo channel" may be computer program instructions, which when executed cause data to be stored in a particular order in physical memory and subsequently read from the same physical memory in the same order in the data was stored. In other words, a pseudo channel can be implemented with either hardware or software.

Pipe data that is based on the first read flag the alignment data strobing signals, and output data stored in a second pseudo channel included in the memory core as other pipe data, is based on the second read flag and the alignment data strobing signals.

In accordance with an embodiment of the present disclosure, a stack memory device comprising a plurality of memory chips stacked over a base chip. In the present disclosure, the base chip may include an operation control circuit configured to: generate a first read flag in synchronization with an alignment data strobing signals when a read operation on a first pseudo channel is performed and generates a second read flag in synchronization with the alignment data strobing signals when a read operation on a second pseudo channel is performed. In the present disclosure, each of the plurality of memory chips may include a memory core including the first pseudo channel and the second pseudo channel, and be configured to output pipe data, based on the alignment data strobing signals, the first read flag, and the second read flag when a read operation on the first pseudo channel or the second pseudo channel is performed.

BRIEF DESCRIPTION OF THE DRAWINGS

FIG. 1 is a block diagram illustrating a configuration of a stack memory device according to an embodiment of the present disclosure.

DETAILED DESCRIPTION

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period in which the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes two bits, when the logic level of each of the two bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
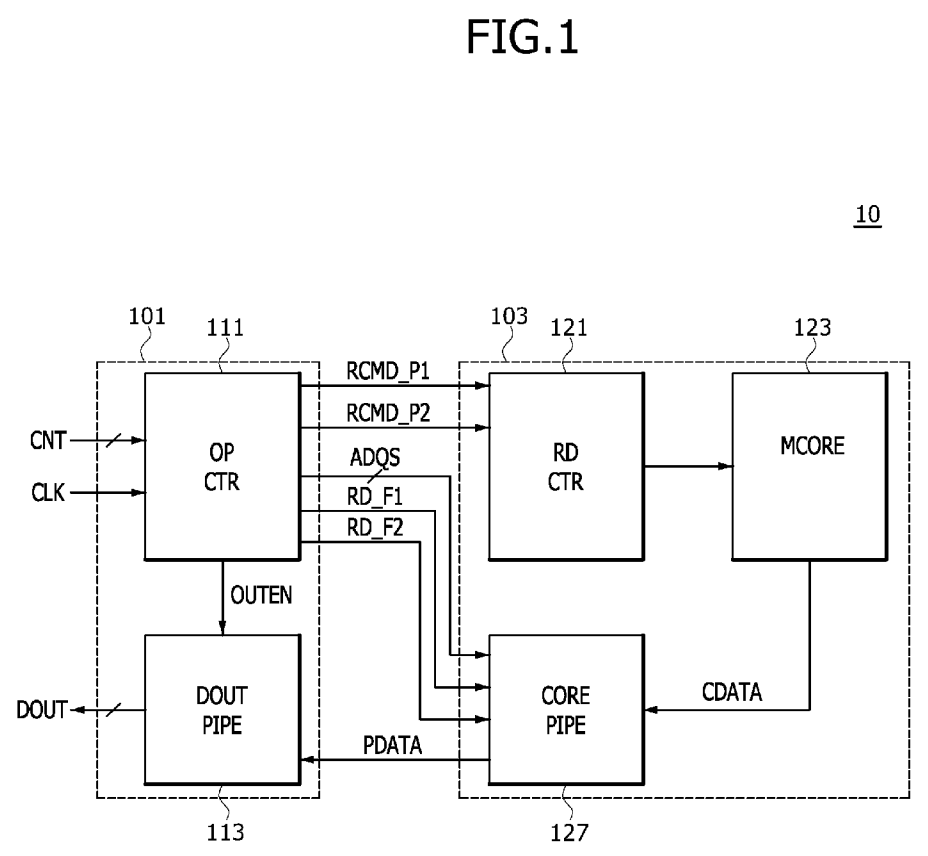
Figure 7:
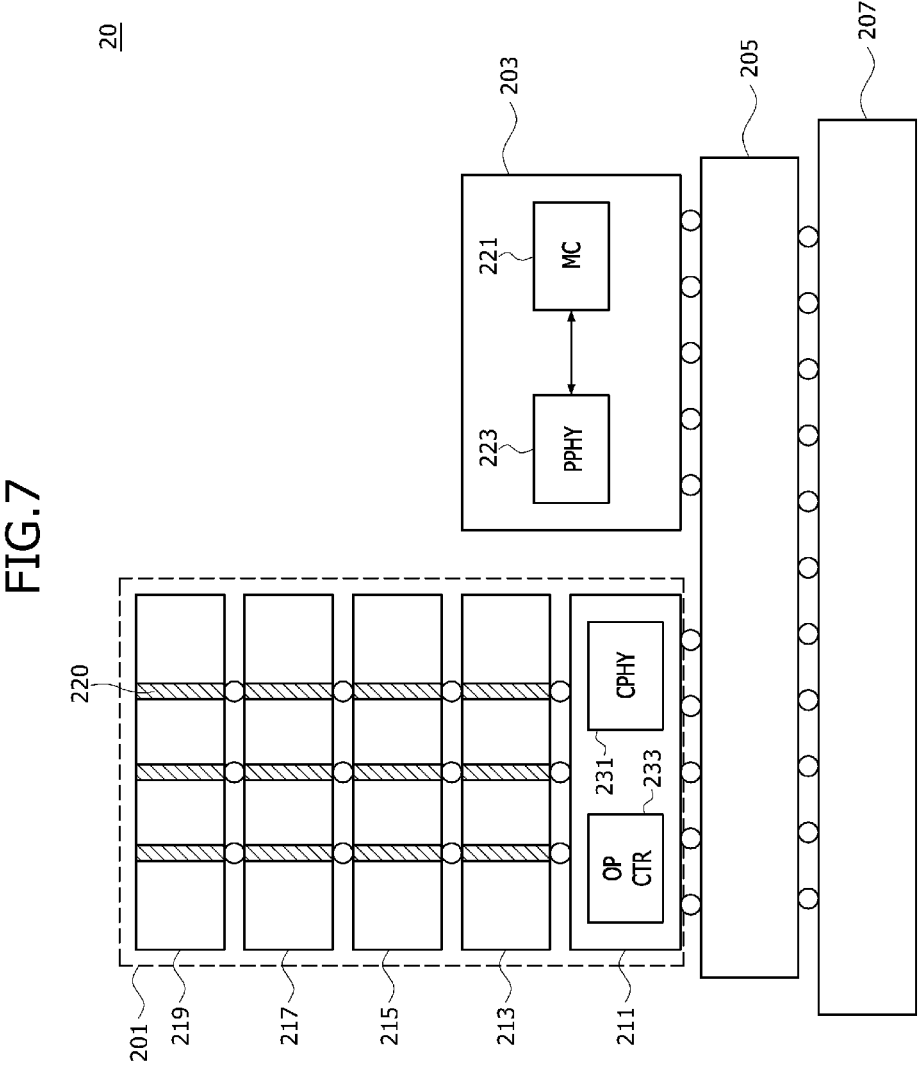
FIG. 7 is a block diagram illustrating a configuration of a stack memory system according to an embodiment of the present disclosure.

FIG. 1 is a block diagram illustrating a configuration of a stack memory device 10 according to an embodiment of the present disclosure. As shown in FIG. 1, the stack memory device 10 may include a base chip 101, so named because the "base chip" may be a support or base for a memory chip 103, as shown in FIG. 7.

The base chip 101 may include an operation control circuit (OP CTR) 111 and an output pipe (DOUT PIPE) 113. The operation control circuit 111 may receive a control signal CNT and a clock signal CLK from a memory controller (e.g., 233 in FIG. 7). The operation control circuit 111 may generate a first pseudo read command RCMD_P1, a second pseudo read command RCMD_P2, alignment data strobing signals ADQS, a first read flag RD_F1, a second read flag RD_F2, and an output control signal OUTEN, based on the control signal CNT and the clock signal CLK. The operation control circuit 111 may generate the first pseudo read command RCMD_P1, based on the control signal CNT when a read operation on a first pseudo channel (e.g., PCH1 in FIG. 8) is performed. The operation control circuit 111 may generate the second pseudo read command RCMD_P2, based on the control signal CNT when a read operation on a second pseudo channel (e.g., PCH2 in FIG. 8) is performed.

The operation control circuit 111 may generate alignment strobing signals ADQS, i.e., a plurality of alignment strobing signals in response to internal data strobing signals (e.g., IDQS in FIG. 3), which may be generated by dividing the clock signal CLK.

The operation control circuit 111 may generate the first read flag RD_F1 in synchronization with at least one data strobing signal ADQS, when the read operation on the first pseudo channel is performed. The operation control circuit 111 may generate the second read flag RD_F2 in synchronization with at least one data strobing signal ADQS, when the read operation on the second pseudo channel is performed.

Figure 8:
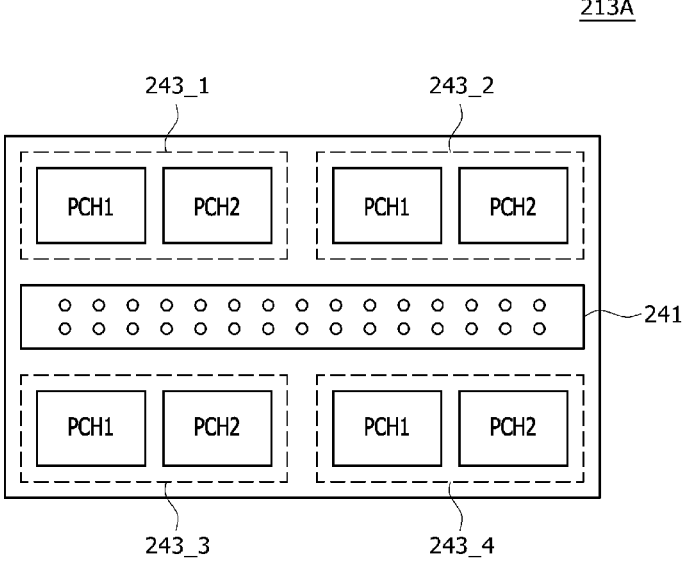
FIG. 8 is a block diagram illustrating a configuration of a first memory chip included in the stack memory system shown in FIG. 7.

The first pseudo channel and the second pseudo channel may be formed by dividing channels (e.g., 243_1, 243_2, 243_3, and 243_4 in FIG. 8). By providing a pseudo channel mode in which the internal operations for the first pseudo channel and the second pseudo channel are performed continuously, channel bandwidth efficiency can be improved. The internal operations may include an active operation, a read operation, a write operation, and the like. The operation control circuit 111 may be electrically connected to a read control circuit 121 and a core pipe 127 of the memory chip 103 to apply the first pseudo read command RCMD_P1 and the second pseudo read command RCMD_P2 to the read control circuit 121 and to apply the alignment data strobing signals ADQS, the first read flag RD_F1, and the second read flag RD_F2 to the core pipe 127. The operation control circuit 111 may generate the output control signal OUTEN for outputting pipe data PDATA stored in the output pipe 113 as output data DOUT when the read operation on the first pseudo channel is performed or the read operation on the second pseudo channel is performed. The output pipe 113 may be electrically connected to the operation control circuit 111 and the core pipe 127 of the memory chip 103 to receive the pipe data PDATA from the core pipe 127, and to receive the output control signal OUTEN from the operation control circuit 111. The output pipe 113 may store the pipe data PDATA and output the stored pipe data PDATA as the output data DOUT, based on the output control signal OUTEN.

The memory chip 103 may include the read control circuit (RD CTR) 121, a memory core (MCORE) 123, and the core pipe (CORE PIPE) 127. The read control circuit 121 may control the read operation on the first pseudo channel and the read operation on the second pseudo channel to be performed continuously in the pseudo channel mode, responsive to the first pseudo read command RCMD_P1 and the second pseudo read command RCMD_P2. The memory core 123 may include the channels (e.g., 243_1, 243_2, 243_3, and 243_4 in FIG. 8), and each of the channels (e.g., 243_1, 243_2, 243_3, and 243_4 in FIG. 8) may be divided into the first pseudo channel and the second pseudo channel. The read operation on the first pseudo channel may be set as a read operation on the first pseudo channel included in a single channel or a read operation on the first pseudo channel included in each of the plurality of channels. The read operation on the second pseudo channel may be set as a read operation on the second pseudo channel included in a single channel or a read operation on the second pseudo channel included in each of the plurality of channels.

The core pipe 127 may receive and store core data CDATA output from the first pseudo channel of the memory core 123 when the read operation on the first pseudo channel is performed and receive and store the core data CDATA output from the second pseudo channel of the memory core 123 when the read operation on the second pseudo channel is performed. The core pipe 127 may output the core data CDATA stored when the read operation on the first pseudo channel is performed as the pipe data PDATA, responsive to the first read flag RD_F1 in synchronization with the alignment data strobing signals ADQS. The core pipe 127 may output the core data CDATA stored when the read operation on the second pseudo channel is performed as the pipe data PDATA, responsive to the second read flag RD_F2 in synchronization with the alignment data strobing signals ADQS.

The base chip 101 may generate the first read flag RD_F1, the second read flag RD_F2, and the alignment data strobing signals ADQS to transmit the first read flag RD_F1, the second read flag RD_F2, and the alignment data strobing signals ADQS to the memory chip 103 through through-vias 220 when the read operation on the first or second pseudo channel of the memory chip 103 is performed. When the read operations for the first pseudo channel and the second pseudo channel are performed, the alignment data strobing signals ADQS are shared and used in the data output operation of each of the first and second pseudo channels, responsive to the first read flag RD_F1 and the second read flag RD_F2, thereby reducing the number of through-vias 220 required when transmitting the alignment data strobing signals ADQS from the base chip 101 to the memory chip 103. The memory chip 103 may be stacked over the base chip 101. Although the stack memory device 10 is shown as including one memory chip 103, this only shows the memory chip 103 on which a read operation is performed for convenience of explanation, and it is preferable that a plurality of memory chips are stacked over one base chip 101.

Figure 2:
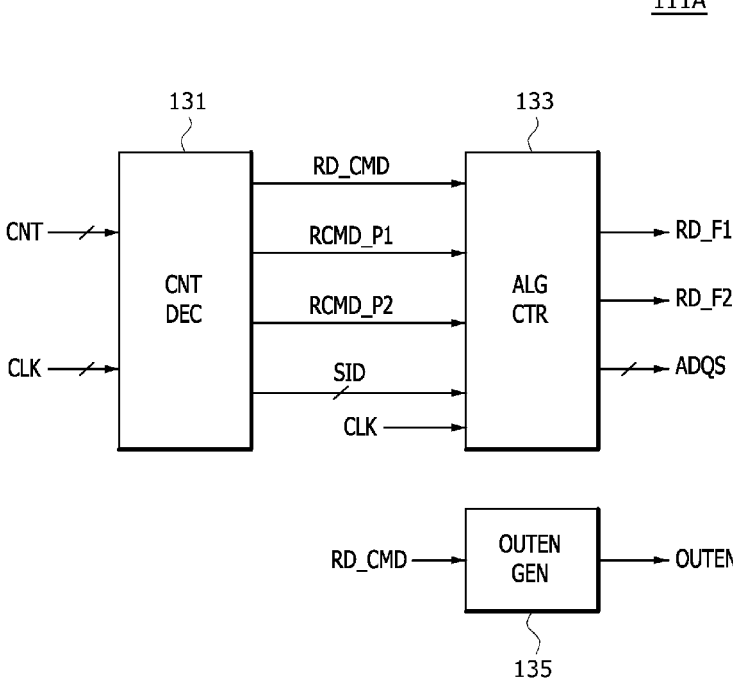
FIG. 2 is a block diagram according to an embodiment of an operation control circuit included in the stack memory device shown in FIG. 1.

FIG. 2 is a block diagram of an operation control circuit 111A according to an embodiment of the operation control circuit 111 shown in FIG. 1. As shown in FIG. 2, the operation control circuit 111A may include a control signal decoder (CNT DEC) 131, an alignment control signal (ALG CTR) 133, and an output control signal generation circuit (OUTEN GEN) 135.

The control signal decoder 131 may decode the control signal CNT, responsive to the clock signal CLK to generate a read command RD_CMD, the first pseudo read command RCMD_P1, the second pseudo read command RCMD_P2, and an identification signal SID. The control signal CNT may include a plurality of bits, and a logic bit set of the bits included in the control signal CNT may be set differently for each read command RD_CMD, first pseudo read command RCMD_P1, second pseudo read command RCMD_P2, and identification signal SID. The read command RD_CMD may be generated for the read operation on the memory core 123, the first pseudo read command RCMD_P1 may be generated for the read operation on the first pseudo channel included in the memory core 123, the second pseudo read command RCMD_P2 may be generated for the read operation on the second pseudo channel included in the memory core 123, and the identification signal SID may be generated to identify one of ranks or one of the plurality of memory chips stacked over the base chip 101. In this embodiment, a logic bit set of bits included in the identification signal SID may be set to select the memory chip 103 or the rank on which the read operation is performed. The control signal decoder 131 may be electrically connected to the alignment control circuit 133 and the output control signal generation circuit 135 to apply the read command RD_CMD, the first pseudo read command RCMD_P1, the second pseudo read command RCMD_P2, and the identification signal SID to the alignment control circuit 133, and to apply the read command RD_CMD to the output control signal generation circuit 135.

The alignment control circuit 133 may generate the first read flag RD_F1, the second read flag RD_F2, and the alignment data strobing signals ADQS, responsive to the clock signal CLK, the read command RD_CMD, the first pseudo read command RCMD_P1, the second pseudo read command RCMD_P2, and the identification signal SID. The alignment control circuit 133 may divide the clock signal CLK to generate the data strobing signals (e.g., IDQS in FIG. 3), may delay the data strobing signals to generate delayed data strobing signals (e.g., IDQSd in FIG. 3), and may output the delayed data strobing signals as the alignment data strobing signals ADQS. The alignment control circuit 133 may store the identification signal SID, responsive to the read command RD_CMD and may generate a first pseudo identification signal (e.g., PSID1 in FIG. 3) from the stored identification signal SID, responsive to the first pseudo read command RCMD_P1 when the read operation on the first pseudo channel is performed. The alignment control signal 133 may store the identification signal SID, responsive to the read command RD_CMD and may generate a second pseudo identification signal (e.g., PSID2 in FIG. 3) from the stored identification signal SID, responsive to the second pseudo read command RCMD_P2 when a read operation on the second pseudo channel is performed. The alignment control circuit 133 may synthesize the first pseudo identification signal PSID1 and the second pseudo identification signal PSID2 to generate a synthetic identification signal (e.g., PSID_S in FIG. 3). The alignment control circuit 133 may latch and delay the first pseudo read command RCMD_P1 to generate a first read command pulse (e.g., RD_CP1 in FIG. 3) when the read operation on the first pseudo channel is performed. The alignment control circuit 133 may latch and delay the second pseudo read command RCMD_P2 to generate a second read command pulse (e.g., RD_CP2 in FIG. 3) when the read operation on the second pseudo channel is performed. The alignment control circuit 133 may align the synthetic identification signal PSID_S, the first read command pulse RD_CP1, and the second read command pulse RD_CP2 in synchronization with the alignment data strobing signals ADQS to generate an alignment identification signal ASID, the first read flag RD_F1, and the second read flag RD_F2.

The output control signal generation circuit 135 may delay the read command RD_CMD to generate the output control signal OUTEN for outputting the pipe data PDATA stored in the output pipe 113 as the output data DOUT. Depending on the embodiments, the output control signal generation circuit 135 may be implemented to generate the output control signal OUTEN, responsive to the first pseudo read command RCMD_P1 and the second pseudo read command RCMD_P2.

Figure 3:
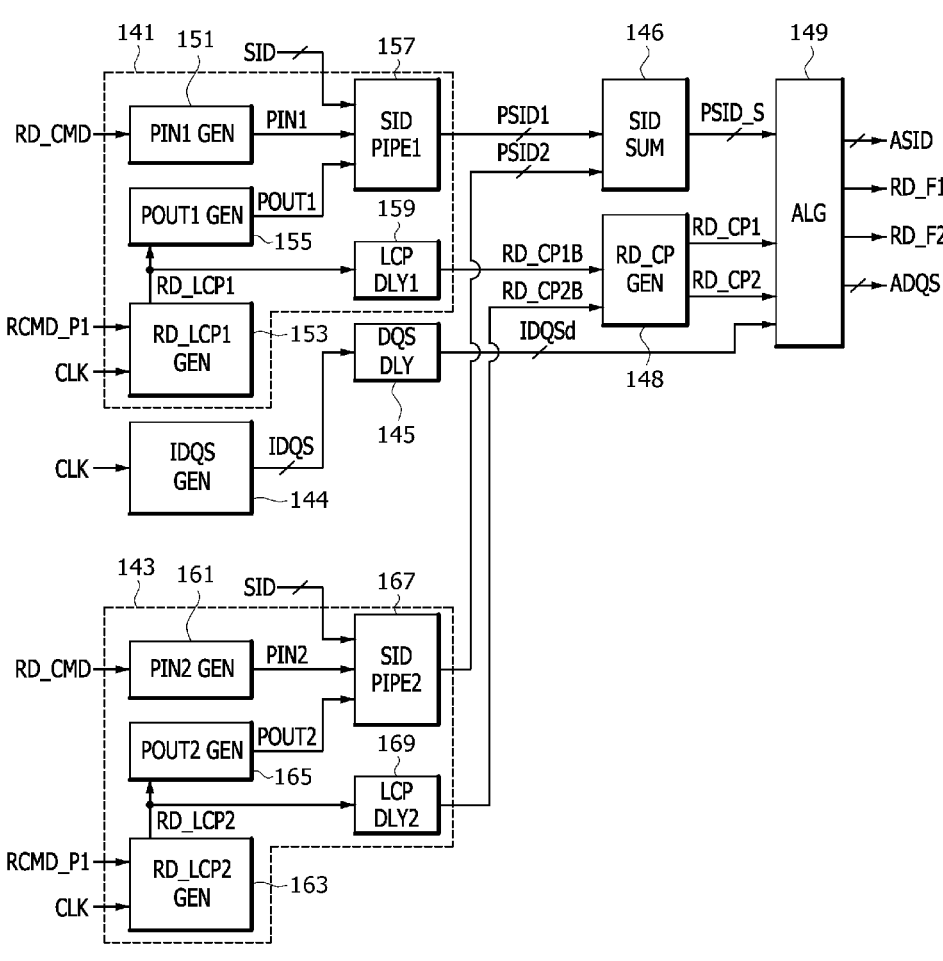
FIG. 3 is a block diagram according to an embodiment of an alignment control circuit included in the operation control circuit shown in FIG. 2.

FIG. 3 is a block diagram of an alignment control circuit 133A according to an embodiment of the alignment control circuit 133 shown in FIG. 2. As shown in FIG. 3, the alignment control circuit 133A may include a first pseudo identification signal generation circuit 141, a second pseudo identification signal generation circuit 143, an internal data strobing signal generation circuit 144, a data strobing signal delay circuit 145, an identification signal synthesis circuit (SID SUM) 146, a pseudo command pulse generation circuit (RD_CP GEN) 148, and an alignment circuit (ALG CIR) 149.

The first pseudo identification signal generation circuit 141 may include a first pipe input signal generation circuit (PIN1 GEN) 151, a first latch command pulse generation circuit (RD_LCP1 GEN) 153, a first pipe output signal generation circuit (POUT1 GEN) 155, a first identification signal pipe (SID PIPE1) 157, and a first latch command pulse delay circuit (LCP DLY1) 159.

The first pipe input signal generation circuit 151 may generate a first pipe input signal PIN1, responsive to the read command RD_CMD. The first pipe input signal generation circuit 151 may generate the first pipe signal PIN1 when the read command RD_CMD is generated. The first latch command pulse generation circuit 153 may generate a first latch command pulse RD_LCP1, responsive to the clock signal CLK and the first pseudo read command RCMD_P1. The first latch command pulse generation circuit 153 may latch the first pseudo read command RCMD_P1 in synchronization with the clock signal CLK, and delay the latched first pseudo read command RCMD_P1 by a first delay section (e.g., td1 in FIG. 4) to output the delayed pseudo read command RCMD_P1 as the first latch command pulse RD_LCP1. The first pipe output signal generation circuit 155 may generate a first pipe output signal POUT1, responsive to the first latch command pulse RD_LCP1. The first identification signal pipe 157 may store the identification signal SID, responsive to the first pipe input signal PIN1, and may output the stored identification signal SID as the first pseudo identification PSID1, responsive to the first pipe output signal POUT1. The first latch command pulse delay circuit 159 may delay the first latch command pulse RD_LCP1 to generate a first inverted read command pulse RD_CP1B. The first pseudo identification signal generation circuit 141 may store the identification signal SID when the read command RD_CMD is generated, may output the stored identification signal SID as the first pseudo identification signal PSID1 when the first delay section elapses after the first pseudo read command RCMD_P1 is generated, and may generate the first inverted read command pulse RD_CP1B in synchronization with the time when the first pseudo identification signal PSID1 is generated.

The second pseudo identification signal generation circuit 143 may include a second pipe input signal generation circuit (PIN2 GEN) 161, a second latch command pulse generation circuit (RD_LCP2 GEN) 163, a second pipe output signal generation circuit (POUT2 GEN) 165, a second identification signal pipe (SID PIPE2) 167, and a second latch command pulse delay circuit (LCP DLY2) 169.

The second pipe input signal generation circuit 161 may generate a second pipe input signal PIN2, responsive to the read command RD_CMD. The second pipe input signal generation circuit 161 may generate the second pipe signal PIN2 when the read command RD_CMD is generated. The second latch command pulse generation circuit 163 may generate a second latch command pulse RD_LCP2, responsive to the clock signal CLK and the second pseudo read command RCMD_P2. The second latch command pulse generation circuit 163 may latch the second pseudo read command RCMD_P2 in synchronization with the clock signal CLK, and delay the latched second pseudo read command RCMD_P2 by a second delay section (e.g., td2 in FIG. 4) to output the delayed second pseudo read command RCMD_P2 as the second latch command pulse RD_LCP2. The second pipe output signal generation circuit 165 may generate a second pipe output signal POUT2, responsive to the second latch command pulse RD_LCP2. The second identification signal pipe 167 may store the identification signal SID, responsive to the second pipe input signal PIN2, and output the stored identification signal SID as the second pseudo identification PSID2, responsive to the second pipe output signal POUT2. The second latch command pulse delay circuit 169 may delay the second latch command pulse RD_LCP2 to generate a second inverted read command pulse RD_CP2B. The second pseudo identification signal generation circuit 143 may store the identification signal SID when the read command RD_CMD is generated, may output the stored identification signal SID as the second pseudo identification signal PSID2 when the second delay section elapses after the second pseudo read command RCMD_P2 is generated, and may generate the second inverted read command pulse RD_CP2B in synchronization with the time when the second pseudo identification signal PSID2 is generated.

The internal data strobing signal generation circuit 144 may divide the clock signal CLK to generate the internal data strobing signals IDQS. The internal data strobing signal IDQS may be generated as a two-divided signal of the clock signal CLK, that is, a signal whose period is twice that of the clock signal CLK, but the present disclosure is not limited thereto. The internal data strobing signals IDQS may include a plurality of signals. As an example, the internal data strobing signals IDQS may include a first internal data strobing signal IDQS1, a second internal data strobing signal IDQS2, a third internal data strobing signal IDQS3, and a fourth internal data strobing signal IDQS4.

The data strobing signal delay circuit 145 may delay the internal data strobing signals IDQS to generate the delayed data strobing signals IDQSd. The delayed data strobing signals IDQSd may include a first delayed data strobing signal IDQSd1, a second delayed data strobing signal IDQSd2, a third delayed data strobing signal IDQSd3, and a fourth delayed data strobing signal IDQSd4.

The identification signal synthesis circuit 146 may be electrically connected to the first pseudo identification signal generation circuit 141 and the second pseudo identification signal generation circuit 143 to receive the first pseudo identification signal PSID1 from the first pseudo identification signal generation circuit 141 and to receive the second pseudo identification signal PSID2 from the second pseudo identification signal generation circuit 143. The identification signal synthesis circuit 146 may generate the synthetic identification signal PSID_S, responsive to the first pseudo identification signal PSID1 and the second first pseudo identification signal PSID2. The identification signal synthesis circuit 146 may synthesize the first pseudo identification signal PSID1 generated from the identification signal SID when the read operation on the first pseudo channel is performed and the second pseudo identification signal PSID2 generated from the identification signal SID when the read operation on the second pseudo channel is performed to generate the synthetic identification signal PSID_S.

The pseudo command pulse generation circuit 148 may be electrically connected to the first pseudo identification signal generation circuit 141 and the second pseudo identification signal generation circuit 143 to receive the first inverted read command pulse RD_CP1B from the first pseudo identification signal generation circuit 141 and to receive the second inverted read command pulse RD_CP2B from the second pseudo identification signal generation circuit 143. The pseudo command pulse generation circuit 148 may inversely buffer the first inverted read command pulse RD_CP1B to generate the first read command pulse RD_CP1. The pseudo command pulse generation circuit 148 may inversely buffer the second inverted read command pulse RD_CP2B to generate the second read command pulse RD_CP2.

The alignment circuit 149 may be electrically connected to the data strobing signal delay circuit 145, the identification signal synthesis circuit 146, and the pseudo command pulse generation circuit 148 to receive the delayed data strobing signals IDQSd from the data strobing signal delay circuit 145, to receive the synthetic identification signal PSID_S from the identification signal synthesis circuit 146, and to receive the first read command pulse RD_CP1 and the second read command pulse RD_CP2 from the pseudo command pulse generation circuit 148. The alignment circuit 149 may generate the alignment data strobing signals ADQS, responsive to the delayed data strobing signals IDQSd. The alignment circuit 149 may buffer the delayed data strobing signals IDQSd to output a buffered signal of the delayed data strobing signals IDQSd as the alignment data strobing signals ADQS, but the present disclosure is not limited thereto. The alignment circuit 149 may align the synthetic identification signal PSID_S, the first read command pulse RD_CP1, and the second read command pulse RD_CP2 in synchronization with the alignment data strobing signals ADQS to generate the alignment identification signal ASID, the first read flag RD_F1, and the second read flag RD_F2. As an example, the alignment circuit 149 may align the synthetic identification signal PSID_S and the first read command pulse RD_CP1 in synchronization with the fourth alignment data strobing signal ADQS4 to generate the alignment identification signal ASID and the first read flag RD_F1, and may align the synthetic identification signal PSID_S and the second read command pulse RD_CP2 in synchronization with the second alignment data strobing signal ADQS2 to generate the alignment identification signal ASID and the second read flag RD_F2.

Figure 4:
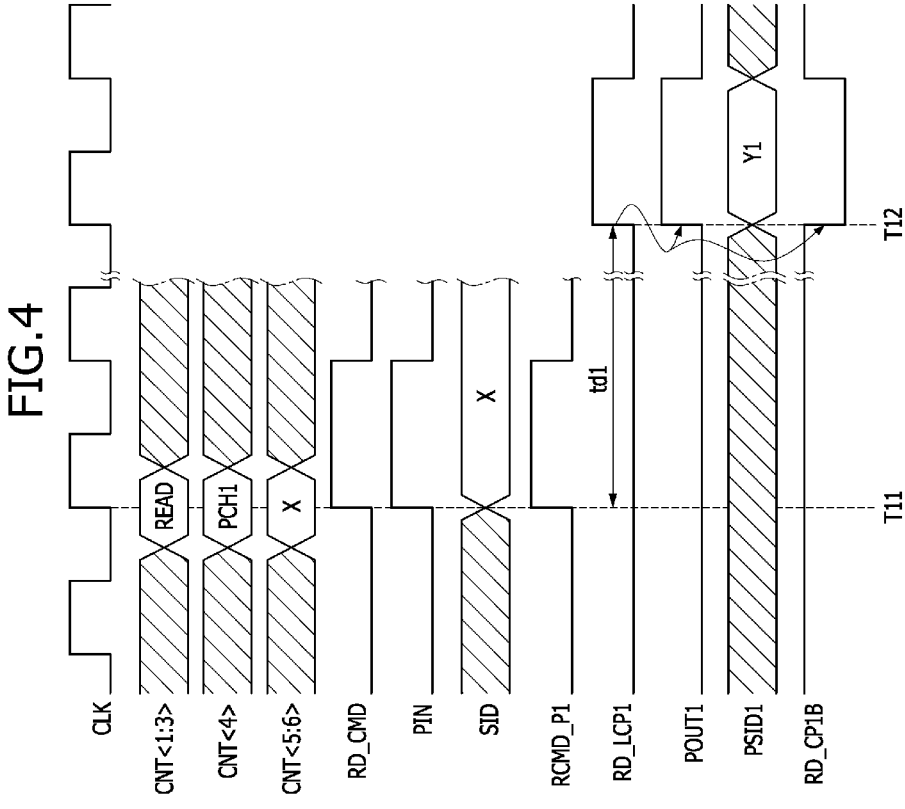
FIGS. 4 to 6 are timing diagrams illustrating operations of the alignment control circuit shown in FIG. 3.
Figure 5:
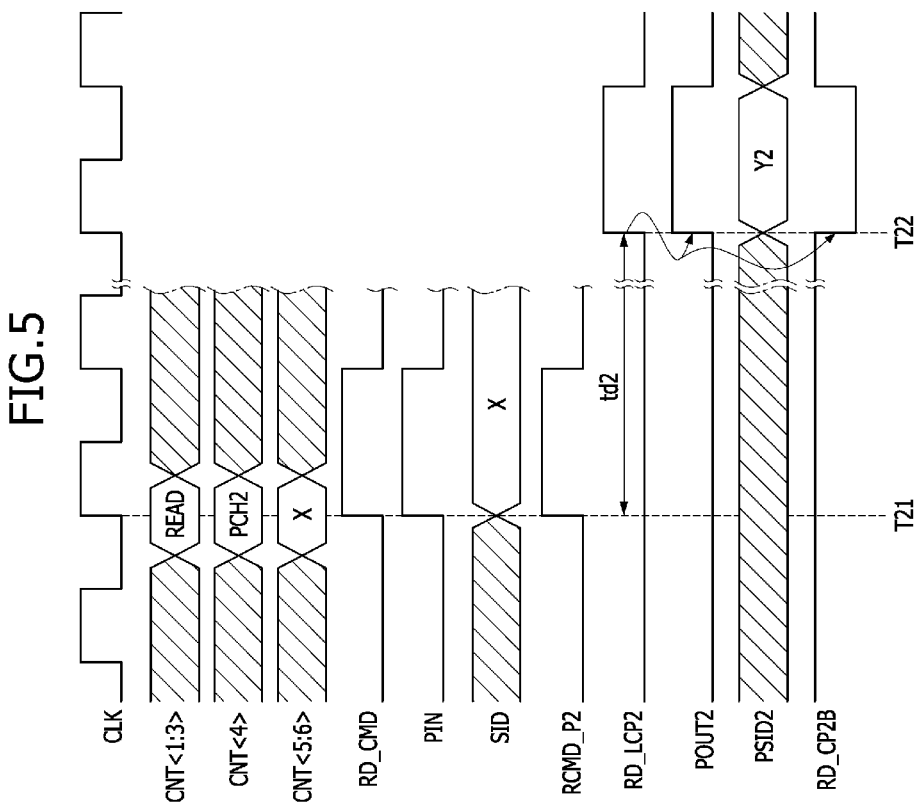
Figure 6:
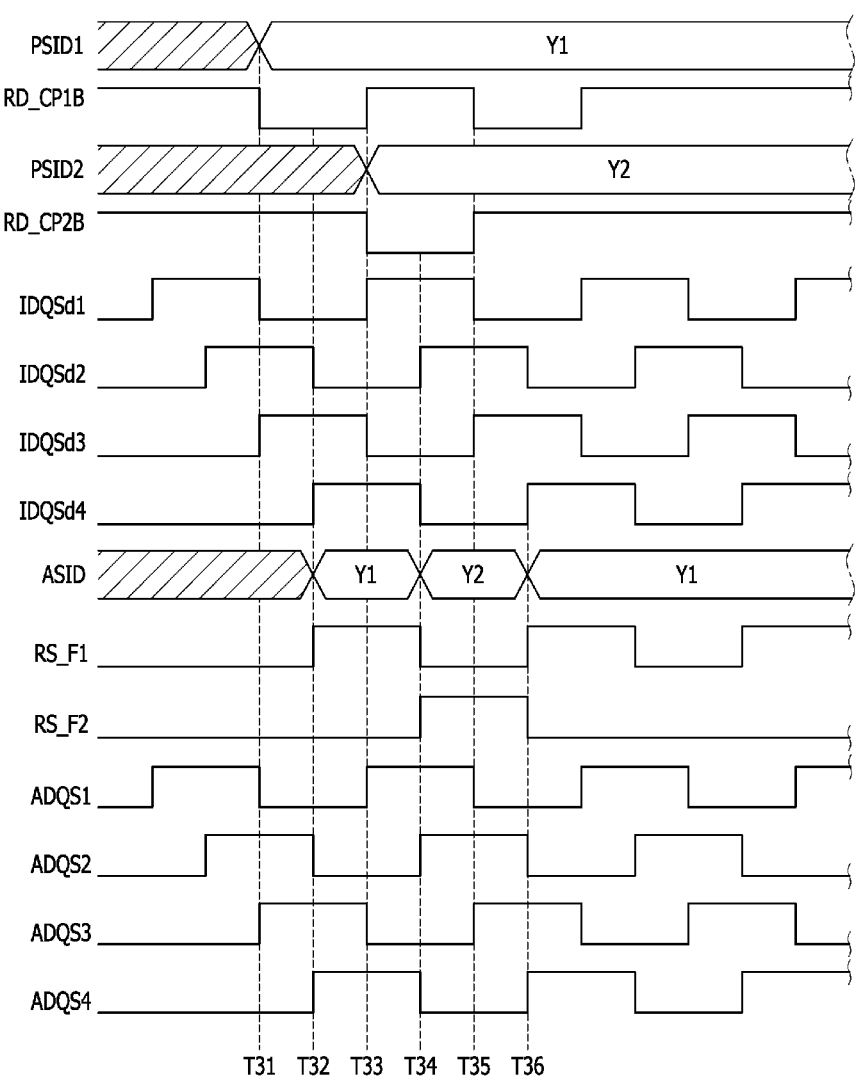

FIGS. 4 to 6 are timing diagrams illustrating the operations of the alignment control circuit 133A shown in FIG. 3.

The operation when a read operation on the first pseudo channel is performed is described with reference to FIGS. 2 to 4, as follows.

As shown in FIGS. 2 and 4, the control signal decoder 131 may decode the control signal CNT, responsive to the clock signal CLK to generate the read command RD_CMD, the first pseudo read command RCMD_P1, and the identification signal SID. More specifically, the control signal decoder 131 may decode the control signal CNT<1:3> at time T11 in synchronization with a rising edge of the clock signal CLK to generate the read command RD_CMD for a read operation, may decode the control signal CNT<4> to generate the first pseudo read command RCMD_P1 for a read operation on the first pseudo channel, and may decode the control signal CNT<5:6> to generate the identification signal SID set to have a logic bit set 'X'.

As shown in FIGS. 3 and 4, the first pipe input signal generation circuit 151 may generate the first pipe input signal PIN1 when the read command RD_CMD is generated, and the first latch command pulse generation circuit 153 may latch the first pseudo read command RCMD_P1 at time T11 in synchronization with the clock signal CLK and delay the latched first pseudo read command RCMD_P1 by a first delay section td1 to generate the first latch command pulse RD_LCP1 at time T12. The first pipe output signal generation circuit 155 may generate the first pipe output signal POUT1, responsive to the first latch command pulse RD_LCP1. The first identification signal pipe 157 may store the identification signal SID, responsive to the first pipe input signal PIN1, and output the stored identification signal SID as the first pseudo identification signal PSID1, responsive to the first pipe output signal POUT1. A logic bit set of the first pseudo identification signal PSID1 may be set to 'Y1', and the logic bit set 'Y1' may be set to be the same as the logic bit set 'X', but the present disclosure is not limited thereto. The first latch command pulse delay circuit 159 may delay the first latch command pulse RD_LCP1 to generate the first inverted read command pulse RD_CP1B.

The operation when a read operation on the second pseudo channel is performed will be described with reference to FIGS. 2, 3, and 5, as follows.

As shown in FIGS. 2 and 5, the control signal decoder 131 may decode the control signal CNT, responsive to the clock signal CLK to generate the read command RD_CMD, the second pseudo read command RCMD_P2, and the identification signal SID. More specifically, the control signal decoder 131 may decode the control signal CNT<1:3> at time T21 in synchronization with a rising edge of the clock signal CLK to generate the read command RD_CMD for a read operation, may decode the control signal CNT<4> to generate the second pseudo read command RCMD_P2 for a read operation on the second pseudo channel, and may decode the control signal CNT<5:6> to generate the identification signal SID set to have a logic bit set 'X'.

As shown in FIGS. 3 and 5, the second pipe input signal generation circuit 161 may generate the second pipe input signal PIN2 when the read command RD_CMD is generated, and the second latch command pulse generation circuit 163 may latch the second pseudo read command RCMD_P2 at time T21 in synchronization with the clock signal CLK and delay the latched second pseudo read command RCMD_P2 by a second delay section td2 to generate the second latch command pulse RD_LCP2 at time T22. The second pipe output signal generation circuit 165 may generate the second pipe output signal POUT2, responsive to the second latch command pulse RD_LCP2. The second identification signal pipe 167 may store the identification signal SID, responsive to the second pipe input signal PIN2, and output the stored identification signal SID as the second pseudo identification signal PSID2, responsive to the second pipe output signal POUT2. A logic bit set of the second pseudo identification signal PSID2 may be set to 'Y2', and the logic bit set 'Y2' may be set to be the same as the logic bit set 'X', but the present disclosure is not limited thereto. The second latch command pulse delay circuit 169 may delay the second latch command pulse RD_LCP2 to generate the second inverted read command pulse RD_CP2B.

The operations when the read operation on the first pseudo channel and the read operation on the second pseudo channel are performed sequentially will be described with reference to FIGS. 3 and 6, as follows.

As shown in FIGS. 3 and 6, when the first pseudo identification signal PSID1 set to have a logic bit set 'Y1' is generated at time T31 and time T35 according to the read operation on the first pseudo channel and the second pseudo identification signal PSID2 set to have logic bit set 'Y2' is generated at time T33 according to the read operation on the second pseudo channel, the alignment circuit 149 may align the synthetic identification signal PSID_S generated by synthesizing the first pseudo identification signal PSID1 in synchronization with the fourth alignment data strobing signal ADQS4 to generate the alignment identification signal ASID set to have the logic bit set 'Y1' at time T32 and time T36, and may align the synthetic identification signal PSID_S generated by synthesizing the second pseudo identification signal PSID2 in synchronization with the second alignment data strobing signal ADQS2 to generate the alignment identification signal ASID set to have the logic bit set 'Y2' at time T34. When the first inverted read command pulse RD_CP1B is generated at time T31 and time T35 according to the read operation on the first pseudo channel and the second inverted read command pulse RD_CP2B is generated at time T33 according to the read operation on the second pseudo channel, the alignment circuit 149 may generate the first read flag RD_F1 at time T32 and time T36 in synchronization with the fourth alignment data strobing signal ADQS4, and may generate the second read flag RD_F2 at time T34 in synchronization with the second alignment data strobing signal ADQS2.

FIG. 7 is a block diagram illustrating a configuration of a stack memory system 20 according to an embodiment of the present disclosure. As shown in FIG. 7, the stack memory system 20 may include a stack memory device 201, a processor 203, an interposer 205, and a substrate 207.

The interposer 205 may be disposed over the substrate 207, the stack memory device 201 and the processor 203 may be disposed over the interposer 205. The interposer 205 may be used to electrically connect the substrate 207, the stack memory device 201, and the processor 203. Because the pitch differences between the substrate 207, the stack memory device 201, and the processor 203 are large, the substrate 207, the stack memory device 201, and the processor 203 may be electrically connected using the interposer 205 including variously formed wires.

The processor 203 may include a memory controller (MC) 221 and a processor interface circuit (PPHY) 223. The memory controller 221 may apply a control signal CNT including commands, addresses, and the like for controlling various internal operations of the stack memory device 201 to the stack memory device 201. The memory controller 221 may apply a clock signal CLK and a control signal CNT to the stack memory device 201 through the processor interface circuit 223.

The stack memory device 201 may include a base chip 211 and memory chips 213, 215, 217, and 219, As shown in the figure, the memory chips 213, 215, 217 and 219 are vertically stacked on top of each other. The "assembly" of those vertically-stacked chips 213, 215, 217 and 219 is stacked on the base chip 211, as shown in the figure. A stack memory device 201 may thus be implemented with the stack memory chips 213, 215, 217 and 219 as shown in FIG. 7.

As used herein, the phrase, "sequentially stacked memory chips" and derivatives of that phrase, should be construed as meaning a set of memory chips, stacked vertically, one atop the other, such that each memory chip of the stack one can be labeled with, or identified by, a number. Stated another way, "sequentially" should NOT be construed as requiring a particular ordered stacking of either identical, similar or dissimilar memory chips on top of each other.

The memory chip 213, 215, 217, and 219 may be sequentially stacked on the top surface 211A of the base chip 211. Each stacked memory chip 213 215, 217, and 219, and may selectively and individually receive one or more signals output from the base chip 211 conductive through-vias, or simply "vias" 220. As FIG. 7 shows, the vias 220 are vertically aligned relative to each other. In the embodiment shown in FIG. 7, each via extends completely through the memory chip in which it is formed.

A full or partial set of the memory chips, i.e., two or more of the memory chips 213 215, 217, and 219 are vertically aligned. In other words, corresponding memory chip vertical surfaces lie in the same geometric vertical planes.

In an alternate embodiment, a subset of the memory chips 213, 215, 217, and 219, i.e., less than four memory chips as shown in FIG. 7, may simultaneously or selectively receive one or more of the same signals output from the base chip 211.

Referring again to FIG. 1, each memory chip 213, 215, 217, and 219, which are stacked on top of each other, on the base chip 211, may receive a first read flag signal RD_F1, a second read flag signal RD_F2, and an alignment data strobing signal ADQS from the base chip 211. Signals such as the first read flag signal RD_F1, the second read flag signal RD_F2, and the alignment data strobing signals signal ADQS, may be sent to one or memory chips 213, 215, 217, and 219 using electrically conductive vias 220, formed in, extending through each memory chip.

When read operations are performed on the first pseudo channel and the second pseudo channel, the memory chips 213, 215, 217, and 219, may share and use the alignment data strobing signals ADQS to control the data output operation, i.e., a read operation, on each of a first pseudo channel and a second pseudo channel. Such a read operation takes place in response to the logical state of the first read flag signal RD_F1 and the logical state of the second read flag signal RD_F2. Accordingly, the number of conductive through-vias required to transmit the alignment data strobing signals ADQS from the base chip 101 to one or more of the memory chips can be reduced.

The base chip 211 may include a core interface circuit (CPHY) 231 and an operation control circuit (OP CTR) 233. The core interface circuit 231 may be configured to enable and provide communication between it and h the processor interface circuit 223. Such communication may include transmitting the clock signal signal CLK and the control signal CNT from the memory controller 221, to the operation control circuit 233, which is located in the base chip 211.

The operation control circuit 233 may generate the first read flag RD_F1 and the second read flag RD_F2 generated in synchronization with the alignment data strobing signals ADQS, responsive to the clock signal CLK and the control signal CNT. The operation control circuit 233 may be implemented with the operation control circuit 111A shown in FIG. 2.

FIG. 8 is a block diagram illustrating a configuration of a memory chip 213A according to an embodiment of the memory chip 213 shown in FIG. 7.

As shown in FIG. 8, a memory chip 213A may include a first channel 243_1, a second channel 243_2, a third channel 243_3, a fourth channel 243_4, and a through-via formation region 241. In one embodiment, the first channel 243_1 and the second channel 243_2 may be located such that they symmetrically located across from each other relative to the through-via formation regio 214. Similarly, the third channel 243_3 and the fourth channel 243_4, may be symmetrically located across from each other relative to the through-via formation regio 214.

Each channel, i.e., the first channel 243_1, the second channel 243_2, the third channel 243_3, and the fourth channel 243_4 may be located in the stack memory device 201 such that each channel has a first pseudo channel PCH1 and a second pseudo channel PCH2.

When a read operation is performed on the first channel 243_1, the second channel 243_2, the third channel 243_3, and the fourth channel 243_4, the read operation on the first pseudo channel PCH1 and the second pseudo channel PCH2 can be performed sequentially. Sequentially performing a second read operation after a first operation, improves channel data transfer rates, which increases the data transferefficiency of the corresponding channels A plurality of through-vias may be formed and located in the through-via formation region 241. In FIG. 7, such vias are identified by reference numeral 220. Alignment data strobing signals ADQS, a first read flag RD_F1, and a second read flag RD_F2 may be transmitted through corresponding ones of the three (3) conductive through-vias 220.

The memory chip 213A might not receive the alignment data strobing signals ADQS for each read operation performed on the first pseudo channel PCH1. The read operation on the second pseudo channel PCH2 may share and use the alignment data strobing signals ADQS, responsive to the first read flag RD_F1 and the second read flag RD_F2, so that the number of through-vias can be reduced.

Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The true scope of the invention disclosed herein is therefore set forth in the appurtenant claims.

What is claimed is:

1. A memory device comprising:
a base chip configured to generate a first read flag, a second read flag, and a plurality of alignment data strobing signals, each of which is generated in response to a clock signal and a control signal, wherein the base chip comprises:
   a control signal decoder configured to decode the control signal, based on the clock signal to generate a read command, a first pseudo read command, a second pseudo read command, and an identification signal; and
   an alignment control circuit configured to divide the clock signal to generate a data strobing signal, generate the alignment data strobing signals, based on the data strobing signal, and generate the first read flag and the second read flag aligned with the alignment data strobing signals, based on the read command, the first pseudo read command, and the second pseudo read command; and
a memory chip configured to output data stored in a first pseudo channel in a memory core as pipe data, data output from the pseudo channel based on the first read flag and the alignment data strobing signals, the memory chip being additionally configured to output data stored in a second pseudo channel in the memory core as the pipe data, the pipe data stored in the second pseudo channel based on the second read flag and the alignment data strobing signals.

2. The memory device of claim 1,
wherein the base chip is configured to receive the clock signal and the control signal from a memory controller, which is configured to control internal operations of the first pseudo channel and control internal operations of the second pseudo channel.

3. The memory device of claim 1, wherein the base chip is configured to:
generate the first read flag when a read operation on the first pseudo channel is performed, and
generate the second read flag when a read operation on the second pseudo channel is performed.

4. The memory device of claim 1,
wherein the base chip comprises an operation control circuit configured to generate the first read flag in synchronization with the alignment data strobing signals when a read operation on the first pseudo channel is performed.

5. The memory device of claim 1,
wherein the base chip comprises an operation control circuit configured to generate the second read flag in synchronization with the alignment data strobing signals when a read operation on the second pseudo channel is performed.

6. The memory device of claim 1,
wherein the base chip comprises:
an operation control circuit configured to generate an output control signal when a read operation on the first pseudo channel or the second pseudo channel is performed; and

an output pipe configured to store the pipe data and output the stored pipe data as output data, based on the output control signal.

7. The memory device of claim 1, wherein the alignment control circuit is configured to:
store the identification signal, responsive to the read command, and generate a first pseudo identification signal from the stored identification signal, responsive to the first pseudo read command,
store the identification signal, responsive to the read command, and generate a second pseudo identification signal from the stored identification signal, responsive to the first pseudo read command, and
synthesize the first pseudo identification signal and the second pseudo identification signal to generate a synthetic identification signal.

8. The memory device of claim 1, wherein the alignment control circuit is configured to:
generate a first read command pulse, responsive to the first pseudo read command,
generate a second read command, responsive to the second pseudo read command, and
align the first read command pulse and the second read command pulse in synchronization with the alignment data strobing signals to generate both the first read flag and the second read flag.

9. The memory device of claim 1, wherein the alignment control circuit comprises:
a first pseudo identification signal generation circuit configured to:
   generate a first pseudo identification signal from the identification signal responsive to the clock signal, the read command, and the first pseudo read command;
   and,
   latch and delay the first pseudo read command in synchronization with the clock signal to generate a first inverted read command pulse;
the memory device additionally comprising:
   a second pseudo identification signal generation circuit configured to generate a second pseudo identification signal from the identification signal, responsive to the clock signal signal, the read command, and the second pseudo read command, and latch and delay the second pseudo read command in synchronization with the clock signal signal to generate a second inverted read command pulse; andan identification signal synthesis circuit configured to synthesize the first pseudo identification signal and the second pseudo identification signal to generate a synthetic identification signal.

10. The memory device of claim 9,
wherein the alignment control circuit further comprises a data strobing signal delay circuit configured to delay internal data strobing signals generated by dividing the clock signal to generate delayed data strobing signals.

11. The memory device of claim 9,
wherein the alignment control circuit further comprises an alignment circuit configured to generate alignment data strobing signals, responsive to delayed data strobing signals, and align the synthetic identification signal, the first read command pulse, and the second read command pulse in synchronization with the alignment data strobing signals to generate an alignment identification signal, the first read flag, and the second read flag.

12. The memory device of claim 11, wherein the alignment data strobing signals comprises a first alignment data strobing signal, a second alignment data strobing signal, a third alignment data strobing signal, and a fourth alignment data strobing signal, and wherein the alignment control circuit is configured to:

align the synthetic identification signal and the first read command pulse in synchronization with the fourth alignment data strobing signal to generate the alignment identification signal and the first read flag, and align the synthetic identification and the second read command pulse in synchronization with the second alignment data strobing signal to generate the alignment identification signal and the second read flag.

13. A stack memory device comprising a plurality of memory chips stacked over a base chip, wherein the base chip comprises:

an operation control circuit configured to:

generate a first read flag in synchronization with alignment data strobing signals when a read operation on a first pseudo channel is performed, and generate a second read flag in synchronization with the alignment data strobing signals when a read operation on a second pseudo channel is performed;

a control signal decoder configured to:

decode a control signal, responsive to a clock signal to generate a read command, a first pseudo read command, a second pseudo read command, and an identification signal; and an alignment control circuit configured to:

divide the clock signal to generate a data strobing signal, generate the alignment data strobing signals, responsive to the data strobing signal, and generate the first read flag and the second read flag aligned with the alignment data strobing signals, responsive to the read command, the first pseudo read command, and the second pseudo read command, and wherein each of the plurality of memory chips comprises a memory core including the first pseudo channel and the second pseudo channel and is configured to output pipe data, responsive to the alignment data strobing signals, the first read flag, and the second read flag when a read operation on the first pseudo channel or the second pseudo channel is performed.

14. The stack memory device of claim 13, wherein the base further comprises an output pipe configured to store the pipe data and output the stored pipe data as output data, responsive to an output control signal.

15. The stack memory device of claim 13, wherein the alignment control circuit is configured to:

store the identification signal, responsive to the read command, and generate a first pseudo identification signal from the stored identification signal, responsive to the first pseudo read command, store the identification signal responsive to the read command, and generate a second pseudo identification signal from the stored identification signal, responsive to the first pseudo read command, and synthesize the first pseudo identification signal and the second pseudo identification signal to generate a synthetic identification signal.

16. The stack memory device of claim 13 wherein the alignment control circuit is configured to:

generate a first read command pulse, responsive to the first pseudo read command, generate a second read command, responsive to the second pseudo read command, and align the first read command pulse and the second read command pulse in synchronization with the alignment data strobing signals to generate the first read flag and the second read flag.

17. The stack memory device of claim 13, wherein the alignment control circuit comprises:

a first pseudo identification signal generation circuit configured to generate a first pseudo identification signal from the identification signal, responsive to the clock signal, the read command, and the first pseudo read command, and latch and delay the first pseudo read command in synchronization with the clock signal to generate a first inverted read command pulse;

a second pseudo identification signal generation circuit configured to generate a second pseudo identification signal from the identification signal responsive to the clock signal, the read command, and the second pseudo read command, and latch and delay the second pseudo read command in synchronization with the clock signal to generate a second inverted read command pulse; and an identification signal synthesis circuit configured to synthesize the first pseudo identification signal and the second pseudo identification signal to generate a synthetic identification signal.

18. The stack memory device of claim 17, wherein the alignment control circuit further comprises an alignment circuit configured to generate alignment data strobing signals, responsive to delayed data strobing signals, and align the synthetic identification signal, the first read command pulse, and the second read command pulse in synchronization with the alignment data strobing signals to generate an alignment identification signal, the first read flag, and the second read flag.

* * * * *